(12) United States Patent
Meng

(10) Patent No.: US 10,923,671 B2
(45) Date of Patent: Feb. 16, 2021

(54) NANOFILM, THIN FILM TRANSISTOR, AND MANUFACTURE METHODS THEREOF

(71) Applicant: BOE Technology Group Co., Ltd., Beijing (CN)

(72) Inventor: Hu Meng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 24 days.

(21) Appl. No.: 16/167,204

(22) Filed: Oct. 22, 2018

(65) Prior Publication Data

US 2019/0280228 A1 Sep. 12, 2019

(30) Foreign Application Priority Data

Mar. 7, 2018 (CN) .......................... 201810188979.8

(51) Int. Cl.
| | |
|---|---|
| *H01L 51/05* | (2006.01) |
| *H01L 29/06* | (2006.01) |
| *H01L 51/00* | (2006.01) |
| *B82Y 10/00* | (2011.01) |
| *H01L 29/16* | (2006.01) |
| *B82Y 30/00* | (2011.01) |
| *B82Y 40/00* | (2011.01) |

(Continued)

(52) U.S. Cl.
CPC .......... *H01L 51/0516* (2013.01); *B82Y 10/00* (2013.01); *H01L 29/0673* (2013.01); *H01L 29/1606* (2013.01); *H01L 51/0048* (2013.01); *B82Y 30/00* (2013.01); *B82Y 40/00* (2013.01); *H01L 29/66015* (2013.01); *H01L 29/66439* (2013.01); *H01L 29/66469* (2013.01); *H01L 29/786* (2013.01)

(58) Field of Classification Search
None
See application file for complete search history.

(56) References Cited

U.S. PATENT DOCUMENTS

| | | | |
|---|---|---|---|
| 10,431,692 B2 | 10/2019 | Meng | |
| 2005/0052894 A1* | 3/2005 | Segal | B82Y 10/00 365/129 |

(Continued)

FOREIGN PATENT DOCUMENTS

| | | |
|---|---|---|
| CN | 103311305 A | 9/2013 |
| CN | 105590665 A | 5/2016 |

(Continued)

OTHER PUBLICATIONS

Office Action issued in corresponding Chinese Patent Application No. 201810188979.8, dated Nov. 29, 2019.

(Continued)

*Primary Examiner* — Michelle Mandala
(74) *Attorney, Agent, or Firm* — McDermott Will & Emery LLP

(57) ABSTRACT

Disclosed is a nanofilm, a thin film transistor and manufacture methods thereof. The nanofilm of the present disclosure comprises a plurality of regions distributed in a film plane dimension, wherein each of the regions is composed of one kind of nanomaterial, and nanomaterials of adjacent regions are different from each other and contact with each other to form a heterojunction or a Schottky junction.

10 Claims, 5 Drawing Sheets

(51) Int. Cl.
  *H01L 29/786*  (2006.01)
  *H01L 29/66*  (2006.01)

(56) References Cited

U.S. PATENT DOCUMENTS

| | | | | |
|---|---|---|---|---|
| 2006/0240218 A1* | 10/2006 | Parce | ...................... | B82Y 30/00 |
| | | | | 428/98 |
| 2016/0133349 A1* | 5/2016 | Cho | ....................... | B82Y 10/00 |
| | | | | 428/196 |
| 2018/0108783 A1 | 4/2018 | Meng | | |
| 2019/0062164 A1* | 2/2019 | Odeh | ....................... | H01M 4/96 |
| 2019/0145752 A1* | 5/2019 | Zhu | ......................... | B32B 5/022 |
| | | | | 73/776 |
| 2019/0270113 A1* | 9/2019 | Pope | ....................... | C30B 29/02 |

FOREIGN PATENT DOCUMENTS

| | | | |
|---|---|---|---|
| CN | 105609638 | A | 5/2016 |
| CN | 106356405 | A | 1/2017 |
| EP | 2261174 | A2 | 12/2010 |

OTHER PUBLICATIONS

Office Action issued in corresponding Chinese Patent Application No. 201810188979.8, dated May 19, 2020.

\* cited by examiner

NANOFILM, THIN FILM TRANSISTOR, AND MANUFACTURE METHODS THEREOF

CROSS REFERENCE TO RELATED APPLICATION

The present application claims a priority benefit of Chinese Patent Application No. 201810188979.8, filed on Mar. 7, 2018, the entirety of which is incorporated herein by reference.

TECHNICAL FIELD

Embodiments of the present disclosure relate to the technical field of manufacturing a thin film, and particularly to a nanofilm, a thin film transistor, and manufacture methods thereof.

BACKGROUND

Recently, low-dimensional nanomaterials, such as carbon nanotube, nanowire, two-dimensional semiconductor material, quantum dot and the like, have become a research focus in the current academic circles and industry. Low-dimensional nanomaterials have large specific surface areas and quantum confinement effects, and such excellent material properties allow them to become alternative materials in future electronics and optoelectronics.

Meanwhile, a heterojunction device formed by contacting two or more semiconductor nanomaterials or a schottky device formed by contacting a metal nanomaterial with a semiconductor nanomaterial plays an important role as a basic construction unit of an active layer in the semiconductor optoelectronic field such as optical detector, photovoltaic device, light emitting diode, or in the field of laser or electronic device.

SUMMARY

The present disclosure provides a nanofilm, a thin film transistor, and manufactures method thereof.

In a first aspect, embodiments of the present disclosure provide a method for manufacturing a nanofilm, comprising: preparing a dispersion in which at least two kinds of nanomaterials are dispersed; preparing an initial film on a base substrate by using the dispersion; and forming a plurality of regions in the initial film, with one kind of the nanomaterials remaining in one region, to form a nanofilm, wherein nanomaterials of adjacent regions are different from each other.

Optionally, the nanomaterial is a semiconductor material, and the semiconductor materials of adjacent regions are contacted with each other to form a heterojunction.

Optionally, the semiconductor materials include a carbon nanotube material, a nanowire material, a quantum dot material, or a two-dimensional semiconductor material.

Optionally, the dispersion is formed by mixing at least two solutions containing different nanomaterials.

Optionally, solvents of the at least two solutions containing different nanomaterials are miscible with each other.

Optionally, the semiconductor materials include a carbon nanotube material and a silicon nanowire material.

Optionally, forming a solution containing the carbon nanotube material comprises treating the carbon nanotube material by polymer encapsulating, sonicating, centrifuging and filtering, to obtain a solution of the semiconductive carbon nanotube material with a purity more than 99%, wherein a solvent of the solution is toluene.

Optionally, forming a solution containing the silicon nanowire material comprises dissolving the silicon nanowire material to obtain a solution of the semiconductive silicon nanowire material, wherein a solvent of the solution is ethanol.

Optionally, said mixing is performed under stirring, such that the nanomaterials are uniformly dispersed in the dispersion.

Optionally, said preparing the initial film on the base substrate by using the dispersion comprises: applying the dispersion on the base substrate; and volatilizing a solvent of the dispersion to form the initial film.

Optionally, said applying the dispersion on the base substrate comprises: applying the dispersion on the base substrate by a printing process or a coating process.

Optionally, said forming a plurality of regions in the initial film, with one kind of the nanomaterials remaining in one region comprises: etching the initial film with different mask plates sequentially, such that one kind of the nanomaterials remains in one region.

Optionally, the dispersion comprises a silicon nanowire material and a carbon nanotube material; and said etching the initial film with different mask plates sequentially such that one kind of the nanomaterials remains in one region comprises: etching the initial film via a first mask plate by using an oxygen plasma etching process, such that the silicon nanowire material remains in a first region; and etching the etched initial film via a second mask plate by using a sulfur hexafluoride dry etching process, such that the carbon nanotube material remains in a second region, wherein the first region is adjacent to the second region.

In a second aspect, embodiments of the present disclosure provide a nanofilm comprising a plurality of regions distributed in a film plane dimension, wherein, each of the regions is composed of one kind of nanomaterial, and nanomaterials of adjacent regions are different from each other, and wherein the nanomaterials of adjacent regions contact with each other to form a heterojunction or a Schottky junction.

Optionally, the nanomaterials include a semiconductor nanomaterial or a metal nanomaterial.

Optionally, the nanomaterials include a nanotube material, a nanowire material, a quantum dot material, or a two-dimensional nanomaterial.

Optionally, the nanomaterials include a carbon nanotube material and a silicon nanowire material.

In a third aspect, embodiments of the present disclosure provide a thin film transistor comprising a base substrate and an active layer on the base substrate, wherein the active layer comprises a plurality of regions distributed in a plane dimension of the active layer, each of the regions is composed of one kind of nanomaterial, and nanomaterials of adjacent regions are different from each other; and wherein the nanomaterials are semiconductor materials, and the semiconductor materials of adjacent regions contact with each other to form a heterojunction.

Optionally, the semiconductor materials include a carbon nanotube material, a nanowire material, a quantum dot material, or a two-dimensional semiconductor material.

In a fourth aspect, embodiments of the present disclosure further provide a method for manufacturing a thin film transistor, comprising: providing a base substrate; forming a nanofilm on the base substrate by using the above-described method for manufacturing a nanofilm, wherein the nanomaterials in the nanofilm are semiconductor materials; and patterning the nanofilm to form an active layer.

Optionally, after providing the base substrate and before forming the nanofilm by using the above-described method for manufacturing a nanofilm, the method further comprises: forming a gate electrode on the base substrate; and forming a gate insulating layer on the gate electrode; and said forming the nanofilm on the base substrate by using the above-described method for manufacturing a nanofilm comprises: forming the nanofilm on the gate insulating layer by using the above-described method for manufacturing a nanofilm.

BRIEF DESCRIPTION OF DRAWINGS

The drawings are used to provide further understandings of the technical solutions of the present disclosure, and form a part of the description. The drawings together with the embodiments of the present application are used to explain, but not to limit the technical solutions of the present disclosure.

DETAILED DESCRIPTION

In order to make the objects, technical solutions and advantages of the present disclosure more clear and apparent, the embodiments of the present disclosure will be described in detail below with reference to the drawings. It should be noted that, unless contradiction, the embodiments of the present application and the features in the embodiments can be combined with each other arbitrarily.

Steps in a flow chart as shown in a drawing may be executed in a computer system such as a group of computers capable of executing instructions. Although a logic sequence is shown in the flow chart, the steps as shown or described may be executed in a sequence different therefrom, in some cases.

Unless otherwise defined, the technical terms or scientific terms used in the embodiments of the present disclosure have usual meanings understood by a person of ordinary skills in the art. The words "first", "second" and the like used in the embodiments of the present disclosure do not indicate any order, number or importance, and are merely intended to distinguish different components. The word "comprise" or "include" or the like means that an element or article present before this word encompasses element(s) or article(s) listed after this word or equivalent(s) thereof, but it does not exclude other element(s) or article(s). The words "above", "below", "left", "right" and the like are only used to indicate relative position relationship. When the absolute position of the object referred to is changed, the relative position relationship may be changed accordingly.

Currently, step-wise manufacture methods are mainly used as methods for manufacturing a nanofilm (or a film formed from a nanomaterial). The current method comprises: 1) manufacturing a first nanofilm on a substrate by a direct manufacture process or a transfer process; 2) manufacturing a second nanofilm on the basis of the first nanofilm by repeating procedure 1); 3) and so on, wherein two or more nanofilms contact with each other through van der Waals force to form a heterojunction. Such a nanofilm requires multiple manufacture procedures or transfer procedures for nanofilms, resulting in a tedious process, difficulty in controlling the proportions of various materials, and poor homogeneity of the film.

In order to at least partially overcome the above technical problems, embodiments of the present disclosure provide a nanofilm, a thin film transistor, and manufactures method thereof.

Figure 1:
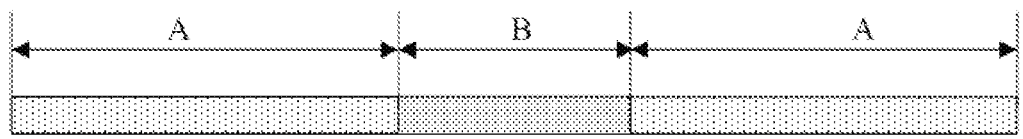
FIG. 1 is a structural schematic diagram of a nanofilm provided in an embodiment of the present disclosure.

FIG. 1 is a structural schematic diagram of a nanofilm provided in an embodiment of the present disclosure. The nanofilm provided in the embodiment of the present disclosure comprises a plurality of regions distributed in a film plane dimension, wherein each of the regions is composed of one kind of nanomaterial, and nanomaterials of adjacent regions are different from each other and contact with each other to form a heterojunction or a Schottky junction. FIG. 1 shows a case where the nanofilm comprises 3 regions of A/B/A, in which region A and region B each are composed of one kind of nanomaterial. However, the number of regions is not particularly limited in the present disclosure, as long as the nanomaterials of adjacent regions are different from each other and contact with each other.

Optionally, the nanomaterials may include a semiconductor nanomaterial or a metal nanomaterial. A heterojunction is formed when two or more semiconductor nanomaterials contact with each other. Or a Schottky junction is formed when a metal nanomaterial contacts with a semiconductor nanomaterial.

Figure 2:
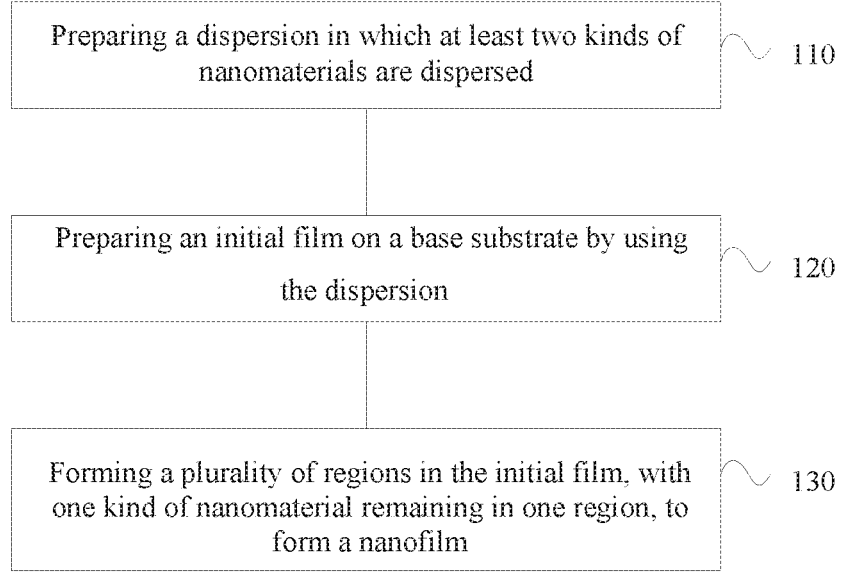
FIG. 2 is a flow chart of a method for manufacturing a nanofilm provided in an embodiment of the present disclosure.

FIG. 2 is a flow chart of a method for manufacturing a nanofilm provided in an embodiment of the present disclosure. As shown in FIG. 2, the method for manufacturing a nanofilm provided in the embodiment of the present disclosure comprises the following steps.

Step 110: preparing a dispersion in which at least two nanomaterials are dispersed.

Optionally, the nanomaterials include a semiconductor nanomaterial, a metal nanomaterial or the like. When the nanomaterials are semiconductor materials, the semiconductor materials may include a carbon nanotube material, a nanowire material, a quantum dot material, or a two-dimensional semiconductor material. The nanowire may include silicon (Si) nanowire, germanium (Ge) nanowire, indium arsenide (InAs) nanowire, indium antimonide (InSb) nanowire, and the like. The two-dimensional semiconductor material may include graphene. The nanomaterials are not particularly limited in the present disclosure.

Step 110 may comprise mixing at least two solutions containing different nanomaterials in a proportion to form a dispersion in which at least two nanomaterials are dispersed. It should be noted that, in the case where the nanomaterial is carbon nanotube, the solvent of the solution containing the carbon nanotube is toluene, and in the case where the nanomaterial is silicon nanowire, the solvent of the solution containing the silicon nanowire is ethanol. The solvents of the solutions containing different nanomaterials may be the same or different, and are not limited in any way in the embodiments of the present disclosure, as long as they can dissolve or disperse the nanomaterials.

Optionally, in the manufacture method provided in the embodiment of the present disclosure, the mixing in Step 110 is performed under stirring, such that the nanomaterials are uniformly dispersed in the dispersion.

Optionally, in the manufacture method provided in the embodiment of the present disclosure, the method further comprises forming at least two solutions containing different nanomaterials, before Step 110.

In the case where the semiconductor material is carbon nanotube, forming a solution containing the carbon nanotube comprises treating the carbon nanotube by polymer encapsulating, sonicating, centrifuging and filtering to obtain a solution of semiconductive carbon nanotube with a purity more than 99%, wherein the solvent is toluene, and the concentration may be about 0.02 mg/mL.

In the case where the semiconductor material is silicon nanowire, forming a solution containing the silicon nanowire comprises preparing silicon nanowire by a chemical vapor deposition (CVD) method under catalysis of gold nanoparticles, and dissolving the silicon nanowire after the catalytical growth, to obtain a solution of the semiconductive silicon nanowire, wherein the solvent is ethanol, and the concentration may be about 0.1 mg/mL.

It should be noted that the preparation methods for solutions containing different nanomaterials may be different from each other, and are not limited in any way in the embodiments of the present disclosure.

In order to ensure that at least two solutions containing different nanomaterials can be mixed, solvents of the at least two solutions containing different nanomaterials are miscible with each other.

Step 120: preparing an initial film on a base substrate by using the dispersion.

Specifically, Step 120 may comprise applying the dispersion on the base substrate by a printing process or a coating process (such as a spin coating process), and volatilizing the solvent in the dispersion by heating or another manner, to form the initial film.

Here, the initial film comprises a plurality kinds of nanomaterials homogeneously mixed with each other.

Step 130: forming a plurality of regions in the initial film, with one kind of nanomaterial remaining in one region, to form a nanofilm.

Specifically, the nanomaterials of adjacent regions are different from each other.

If the nanomaterial is a semiconductor material, the semiconductor materials of adjacent regions contact with each other to form a heterojunction, wherein the heterojunction is a transverse heterojunction.

Here, Step 130 may comprise etching the initial film with different mask plates sequentially, such that one kind of nanomaterial remains in one region.

In the case where the dispersion comprises carbon nanotube and silicon nanowire, after forming the initial film comprising the carbon nanotube and the silicon nanowire according to Step 120, Step 130 comprises: etching the initial film via a first mask plate by an oxygen plasma etching process, such that the silicon nanowire remains in a first region; and etching the etched initial film via a second mask plate by a sulfur hexafluoride dry etching process, such that the carbon nanotube remains in a second region, wherein the first region is adjacent to the second region. It should be noted that, in order to remain corresponding nanomaterial, the use of corresponding etching process is required to perform the etching. The corresponding etching process is not particularly limited in the embodiments of the present disclosure.

In the embodiments of the present disclosure, by forming an initial film comprising a plurality of nanomaterials homogeneously mixed from a dispersion containing different nanomaterials and treating the initial film, a nanofilm in which the nanomaterials of adjacent regions are different from each other is obtained. As such, it results in a simplified method for manufacturing nanofilm, controlled proportions of materials, and good homogeneity of the film.

The method for manufacturing a nanofilm provided in the embodiments of the present disclosure will be further described below with reference to FIG. 3A to FIG. 3D, by taking two semiconductor materials, i.e. carbon nanotube and silicon nanowire, as examples.

Figure 3A:
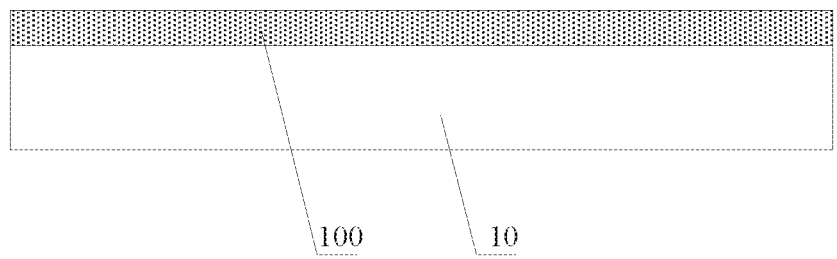
FIG. 3A is a schematic diagram I of a method for manufacturing a nanofilm provided in an embodiment of the present disclosure.

Step 210: mixing a solution containing carbon nanotube and a solution containing silicon nanowire in a proportion to form a mixed solution, and preparing an initial film 100 from the mixed solution on a base substrate 10, as shown in FIG. 3A.

Here, the initial film 100 comprises the carbon nanotube and the silicon nanowire homogeneously mixed.

Figure 3B:
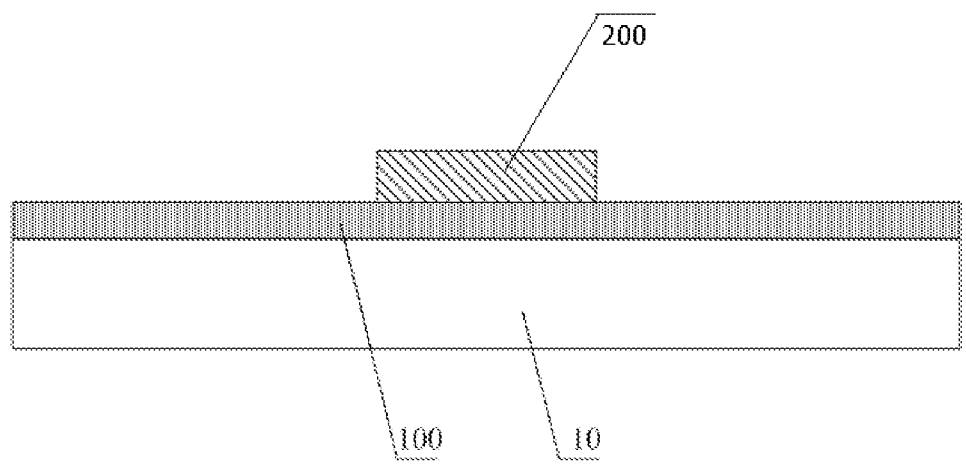
FIG. 3B is a schematic diagram II of a method for manufacturing a nanofilm provided in an embodiment of the present disclosure.

Step 220: coating a photoresist on the initial film 100, and forming a first etching window with a first mask plate 200 through an exposure and development process, as shown in FIG. 3B.

The number of the first etching window is two in this embodiment of the present disclosure, but it may be one, or more than two. The number of the first etching window can be determined according to actual requirements.

Figure 3C:
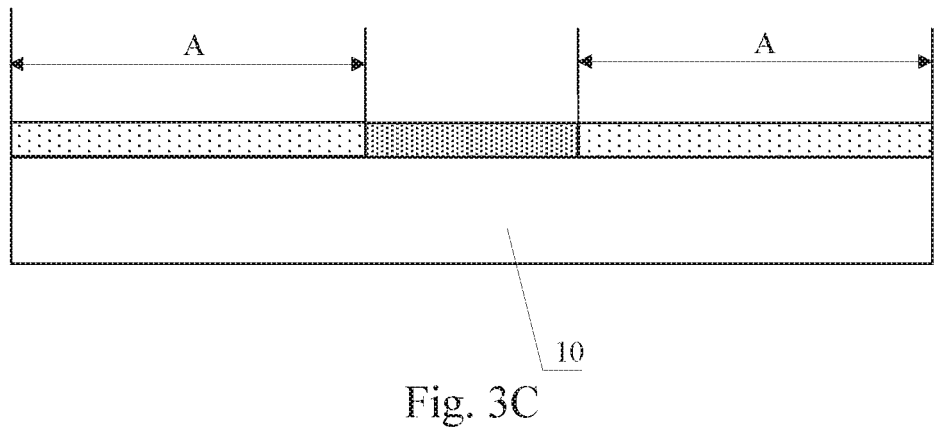
FIG. 3C is a schematic diagram III of a method for manufacturing a nanofilm provided in an embodiment of the present disclosure.

Step 230: removing the carbon nanotube in the first etching window by using an oxygen plasma etching process to form a first region A with the silicon nanowire remained, and stripping off the photoresist, as shown in FIG. 3C.

Figure 3D:
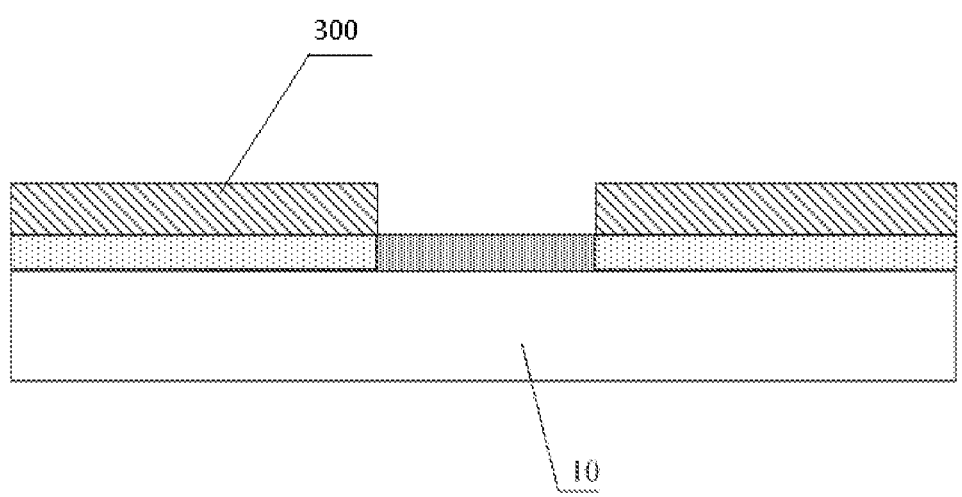
FIG. 3D is a schematic diagram IV of a method for manufacturing a nanofilm provided in an embodiment of the present disclosure.

Step 240: coating a photoresist on the etched initial film, and forming a second etching window with a second mask plate 300 through an exposure and development process, as shown in FIG. 3D.

Figure 3E:
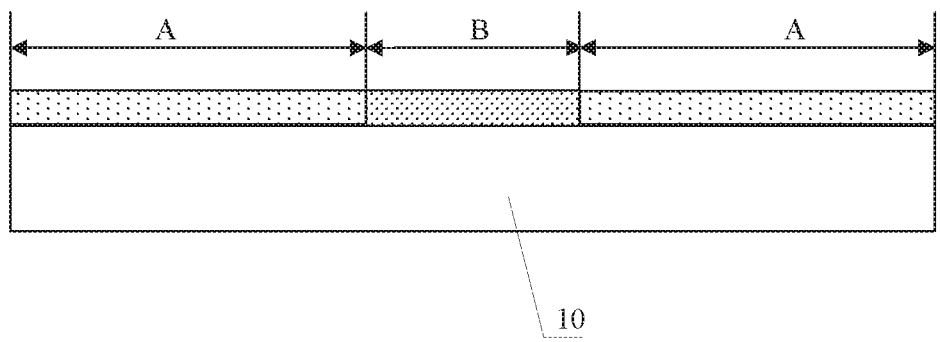
FIG. 3E is a schematic diagram V of a method for manufacturing a nanofilm provided in an embodiment of the present disclosure.

Step 250: removing the silicon nanowire in the second etching window by using a $SF_6$ dry etching process to form a second region B with the carbon nanotube remained, and stripping off the photoresist, to form the nanofilm, as shown in FIG. 3E.

Based on the inventive concept of the above embodiment, an embodiment of the present disclosure further provides a nanofilm manufactured by using the method for manufacturing a nanofilm provided in the above embodiment.

Here, the nanofilm is manufactured by using the method for manufacturing a nanofilm provided in the above embodiment, and the principle and effect achieved thereby are similar and are not reiterated here.

Figure 4:
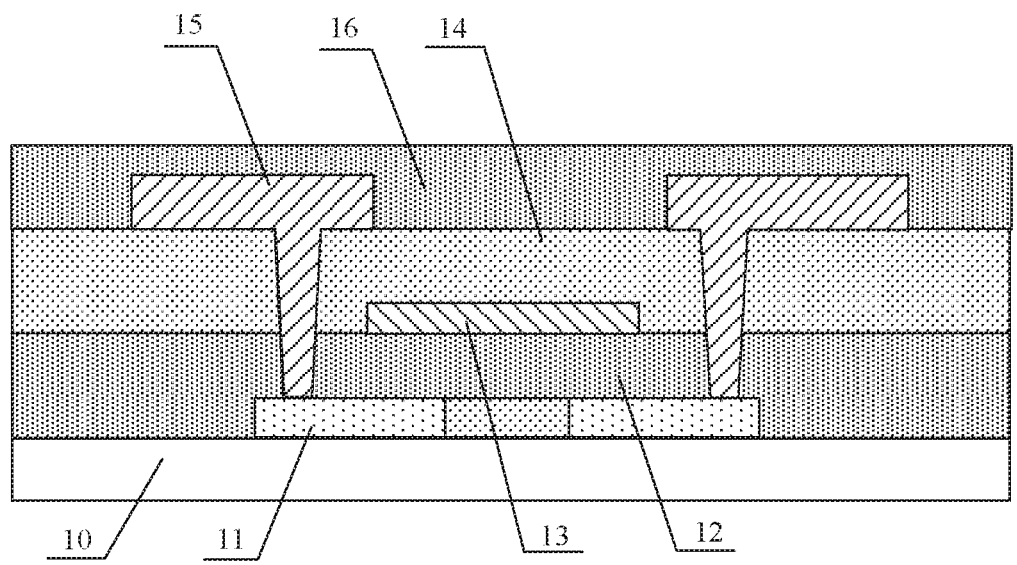
FIG. 4 is a structural schematic diagram of a thin film transistor provided in an embodiment of the present disclosure.

Based on the inventive concept of the above embodiments, FIG. 4 is a structural schematic diagram of a thin film transistor provided in an embodiment of the present disclosure. As shown in FIG. 4, the thin film transistor provided in the embodiment of the present disclosure comprises a base substrate 10 and an active layer 11 on the base substrate 10, wherein the active layer comprises a plurality of regions, and each of the regions is composed of one kind of nanomaterial; and wherein the nanomaterials are semiconductor materials, and the semiconductor materials of adjacent regions are different from each other and contact with each other to form a heterojunction.

Optionally, the nanomaterials include a carbon nanotube material, a nanowire material, a quantum dot material or a two-dimensional semiconductor material, wherein the nanowire may include silicon (Si) nanowire, germanium (Ge) nanowire, indium arsenide (InAs) nanowire, indium antimonide (InSb) nanowire, and the like. The nanomaterials are not particularly limited in the present disclosure.

It should be noted that, the thin film transistor provided in the embodiment of the present disclosure may have a top gate structure or a bottom gate structure. FIG. 4 illustrates a top gate structure as an example, wherein the thin film transistor further comprises a gate insulating layer 12, a gate electrode 13, a passivating layer 14, source/drain electrodes 15 and a planarization layer 16. Specifically, the active layer 11 is disposed on the base substrate 10.

Figure 5:
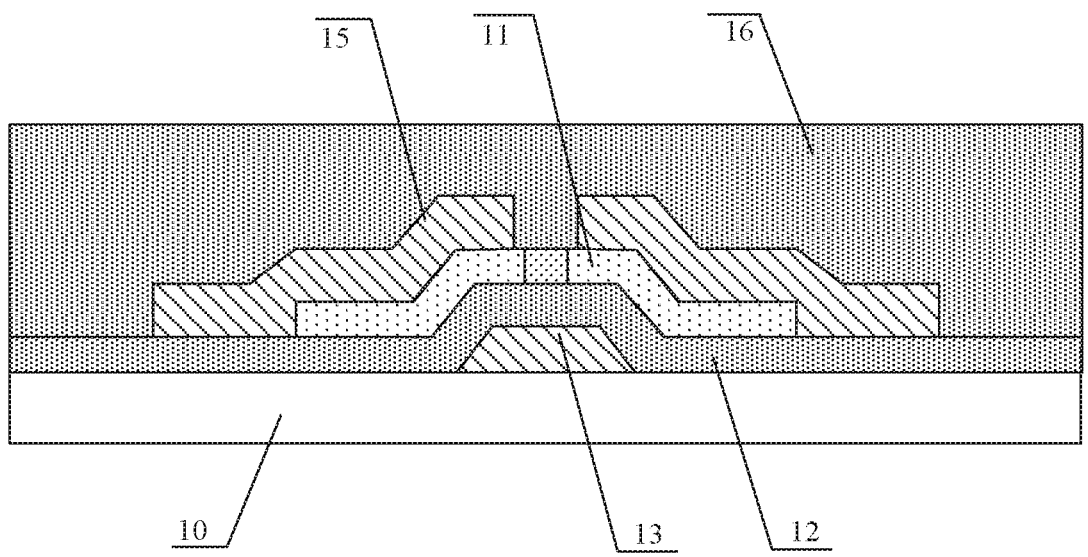
FIG. 5 is another structural schematic diagram of a thin film transistor provided in an embodiment of the present disclosure.

FIG. 5 is another structural schematic diagram of a thin film transistor provided in an embodiment of the present disclosure. FIG. 5 illustrates a bottom gate structure as an example, wherein the thin film transistor further comprises a gate insulating layer 12, a gate electrode 13, source/drain electrodes 15 and a planarization layer 16. Specifically, the active layer 11 is disposed on the gate insulating layer 12.

As a heterojunction is introduced into the active layer provided in the embodiment of the present disclosure, the current of the thin film transistor can be controlled through the heterojunction (heterojunction energy band).

Based on the inventive concept of the above embodiments, an embodiment of the present disclosure further provides a method for manufacturing a thin film transistor comprising the following steps.

Step 310: providing a base substrate.

Optionally, the base substrate includes a glass substrate, a plastic substrate, a quartz substrate or the like, and is not limited in any way in the embodiment of the present disclosure. Further, before forming the thin film transistor, the base substrate may be subjected to a pre-washing operation.

Step 320: forming a nanofilm on the base substrate by using the method for manufacturing a nanofilm provided in the above embodiment.

Specifically, the nanomaterials in the nanofilm are semiconductor materials.

Step 330: treating the nanofilm with a patterning process to form an active layer.

In the case that the nanofilm comprises carbon nanotube and silicon nanowire, and two heterojunctions are comprised in the active layer structure, the active layer may have a structure of silicon nanowire/carbon nanotube/silicon nanowire, or carbon nanotube/silicon nanowire/carbon nanotube, which is not limited in any way in the embodiment of the present disclosure.

Here, the patterning process referred comprises processes of photoresist applying, exposing, developing, etching, photoresist stripping off and the like.

It should be noted that the thin film transistor provided in the embodiments of the present disclosure may have a top gate structure or a bottom gate structure, which is not limited in the embodiments of the present disclosure.

The thin film transistor obtained by using the method for manufacturing a thin film transistor provided in the embodiments of the present disclosure have a homogeneously distributed heterojunction, and the heterojunction proportion can be precisely controlled.

As an implementation, if the thin film transistor has a top gate structure (as shown in FIG. 4), after Step 330, the method for manufacturing a thin film transistor provided in the embodiments of the present disclosure further comprises: forming a gate insulating layer 12 on the active layer 11; forming a gate electrode 13 on the gate insulating layer 12; forming a passivating layer 14 on the gate electrode 13; forming source/drain electrodes 15 on the passivating layer 14, wherein the source/drain electrodes 15 are connected with the active layer 11 through a via hole; and forming a planarization layer 16 on the source/drain electrodes 15.

As another implementation, if the thin film transistor has a bottom gate structure (as shown in FIG. 5), after Step 310, the method further comprises forming a gate electrode 13 on the base substrate 10, and forming a gate insulating layer 12 on the gate electrode 13; and Step 320 comprises forming a nanofilm on the gate insulating layer by using the method for manufacturing a nanofilm provided in the embodiments of the present disclosure; and after Step 330, the method further comprises forming source/drain electrodes 15 on the active layer 11, and forming a planarization layer 16 on the source/drain electrodes 15.

Figure 6:
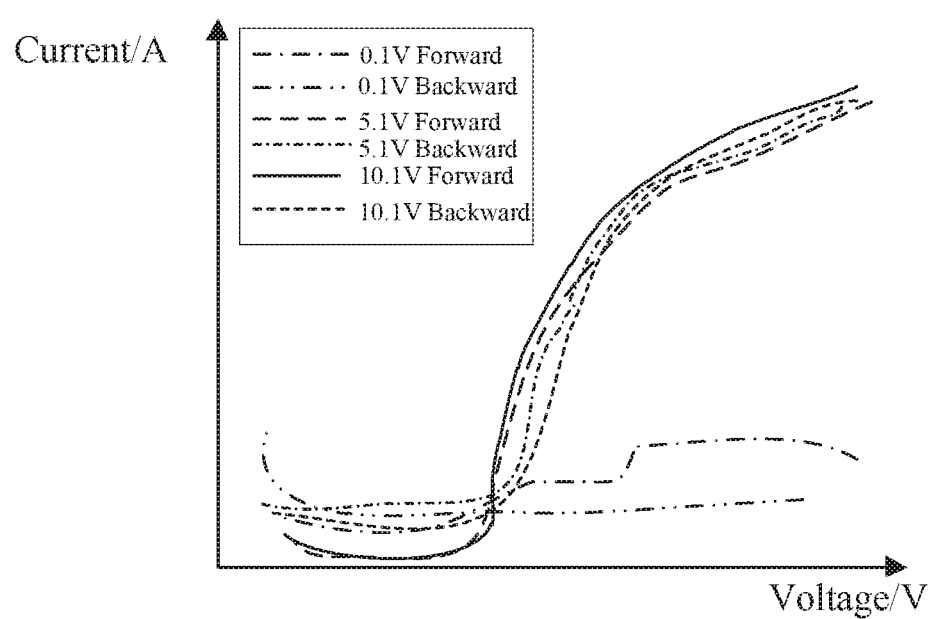
FIG. 6 is a schematic diagram showing a relationship between the voltage and the current of a thin film transistor provided in an embodiment of the present disclosure.

FIG. 6 is a schematic diagram showing a relationship between the voltage and the current of a thin film transistor provided in an embodiment of the present disclosure. As shown in FIG. 6, the voltage refers to the gate electrode voltage applied, the current refers to the current passing through the source/drain electrodes, and 0.1 V, 5.1 V and 10.1 V refer to the voltages of the source/drain electrodes. In the case of applying same gate electrode voltages, the currents of the source/drain electrodes corresponding to the voltages of the source/drain electrodes with different values and in different directions are not the same. In the embodiments of the present disclosure, because a heterojunction is used, the current property of the thin film transistor can be modulated by the heterojunction. As compared with one having the current active layer structure, the thin film transistor provided in the embodiments of the present disclosure can be better applied in the field of logic circuit.

The following points should be noted.

The drawings in the present disclosure only relate to the structures involved in the embodiments of the present disclosure, and reference can be made to usual designs for other structures.

For clarity, in the drawings for describing the embodiments of the present disclosure, the thickness and size of a layer or a microstructure are enlarged. It should be understood that when an element such as a layer, a film, an area or a substrate is referred to as being positioned "above" or "below" another element, the element may be directly positioned "above" or "below" the another element, or there may be an intermediate element.

Unless contradiction, the features in the embodiments of the present disclosure are allowed to be combined with each other to obtain a new embodiment.

Although the embodiments of the present application are illustrated as above, the contents described are only for the convenience of understanding the present invention, but not intended to limit the present invention. One skilled in the art can make any modification or change on the forms and details of the embodiments without departing from the spirit and scope of the present application. The protection scope of the present invention is defined by the appended claims.

What is claimed is:

1. A method for manufacturing a nanofilm, comprising:
preparing a dispersion in which at least two kinds of nanomaterials are dispersed;
preparing an initial film on a base substrate by using the dispersion, said initial film comprising the at least two kinds of nanomaterials; and
forming a plurality of regions in the initial film, with one kind of the nanomaterials remaining in one region, to form a nanofilm, wherein nanomaterials of adjacent regions are different from each other,
wherein the plurality of regions are in the same layer and their orthographic projections on the base substrate are not overlapped each other, and
wherein the dispersion comprises a silicon nanowire material and a carbon nanotube material, and
said forming a plurality of regions in the initial film, with one kind of the nanomaterials remaining in one region comprises etching the initial film with different mask plates sequentially, such that one kind of the nanomaterials remains in one region, and
said etching the initial film with different mask plates sequentially such that one kind of the nanomaterials remains in one region comprises:
etching the initial film via a first mask plate by using an oxygen plasma etching process, such that the silicon nanowire material remains in a first region; and
etching the etched initial film via a second mask plate by using a sulfur hexafluoride dry etching process, such that the carbon nanotube material remains in a second region,
wherein the first region is adjacent to the second region.

2. The method according to claim 1, wherein the nanomaterials are semiconductor materials, and the semiconductor materials of adjacent regions are contacted with each other to form a heterojunction.

3. The method according to claim 1, wherein the dispersion is formed by mixing at least two solutions containing different nanomaterials.

4. The method according to claim 3, wherein solvents of the at least two solutions containing different nanomaterials are miscible with each other.

5. The method according to claim 3, wherein the semiconductor materials include a carbon nanotube material and a silicon nanowire material,
forming a solution containing the carbon nanotube material comprises treating the carbon nanotube material by polymer encapsulating, sonicating, centrifuging and filtering, to obtain a solution of the semiconductive carbon nanotube material with a purity more than 99%, wherein a solvent of the solution is toluene; and
forming a solution containing the silicon nanowire material comprises dissolving the silicon nanowire material to obtain a solution of the semiconductive silicon nanowire material, wherein a solvent of the solution is ethanol.

6. The method according to claim 3, wherein said mixing is performed under stirring, such that the nanomaterials are uniformly dispersed in the dispersion.

7. The method according to claim 1, wherein said preparing the initial film on the base substrate by using the dispersion comprises:
applying the dispersion on the base substrate; and
volatilizing a solvent of the dispersion to form the initial film.

8. The method according to claim 7, wherein said applying the dispersion on the base substrate comprises:
applying the dispersion on the base substrate by a printing process or a coating process.

9. The method according to claim 1, further comprising patterning the nanofilm to form a thin film transistor, wherein the nanomaterials in the nanofilm are semiconductor materials.

10. The method according to claim 9, wherein before forming the nanofilm,
forming a gate electrode on the base substrate; and
forming a gate insulating layer on the gate electrode,
wherein the nanofilm is formed on the gate insulating layer.

* * * * *